United States Patent
Toyoda et al.

(10) Patent No.: US 9,287,337 B2
(45) Date of Patent: Mar. 15, 2016

(54) ORGANIC ELECTRO-LUMINESCENCE DISPLAY DEVICE AND METHOD OF FABRICATING THE SAME

(71) Applicant: Japan Display Inc., Tokyo (JP)

(72) Inventors: Hironori Toyoda, Tokyo (JP); Toshihiro Sato, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 14/559,947

(22) Filed: Dec. 4, 2014

(65) Prior Publication Data

US 2015/0155341 A1 Jun. 4, 2015

(30) Foreign Application Priority Data

Dec. 4, 2013 (JP) .................. 2013-251191

(51) Int. Cl.
*H01L 27/32* (2006.01)
*H01L 51/56* (2006.01)

(52) U.S. Cl.
CPC ............ *H01L 27/3246* (2013.01); *H01L 51/56* (2013.01)

(58) Field of Classification Search
None
See application file for complete search history.

(56) References Cited

U.S. PATENT DOCUMENTS

| 2007/0170847 | A1 | 7/2007 | Kumaki et al. | |
| 2007/0222379 | A1* | 9/2007 | Yamazaki et al. | 313/509 |
| 2011/0199684 | A1* | 8/2011 | Hashimoto et al. | 359/586 |
| 2013/0001168 | A1* | 1/2013 | Kim et al. | 210/676 |
| 2013/0285042 | A1* | 10/2013 | Komatsu | H01L 27/3279 257/40 |

FOREIGN PATENT DOCUMENTS

JP 4877874 B2 12/2011

* cited by examiner

*Primary Examiner* — Charles Garber
*Assistant Examiner* — Brigitte Paterson
(74) *Attorney, Agent, or Firm* — Typha IP LLC

(57) ABSTRACT

A first substrate provided with a plurality of pixel electrodes is prepared. A bank layer is formed so as to be placed on the periphery of each pixel electrode to define a plurality of pixel regions and contain a metal ion adsorbent. An organic electro-luminescence film is formed so as to be placed on the bank layer and the plurality of pixel electrodes and contain a metal complex which is a compound having a ligand coordinated to a metal ion. A common electrode is formed on the organic electro-luminescence film. The organic electro-luminescence film is formed such that the concentration of the metal ions is decreased above the bank layer by the metal ion adsorbent.

12 Claims, 6 Drawing Sheets

ORGANIC ELECTRO-LUMINESCENCE DISPLAY DEVICE AND METHOD OF FABRICATING THE SAME

CROSS-REFERENCE TO RELATED APPLICATION

The present application claims priority from Japanese application JP2013-251191 filed on Dec. 4, 2013, the content of which is hereby incorporated by reference into this application.

BACKGROUND OF THE INVENTION

1. Field of the Invention

The present invention relates to an organic electro-luminescence display device and a method of fabricating the same.

2. Description of the Related Art

In an organic electro-luminescence display device, color mixing was caused by the light emission of an adjacent pixel which was originally not supposed to emit light. As a result of studies, it was found that there are two types of modes in color mixing: one is optical color mixing which is caused by the entry of light emitted in an oblique direction into an adjacent pixel; and the other is electric color mixing which is caused by the light emission of an adjacent pixel due to the flow of an electric charge in the horizontal direction. With respect to the latter color mixing among these, one of the causes is considered to be that an electron injection layer containing lithium serves as a conductive layer in the horizontal direction. Japanese Patent No. 4877874 discloses that a substance for improving carrier injectability from an electrode to an organic layer is incorporated in an electron injection layer.

Lithium is indispensable for charge injection and transport, and therefore cannot be completely removed from the electron injection layer. Alternatively, it is possible to suppress charge transfer by patterning the electron injection layer. In such a case, a new tool such as a vapor deposition mask is needed, and an additional machining process is also needed.

SUMMARY OF THE INVENTION

An object of the invention is to control electric color mixing at a low cost.

(1) A method of fabricating an organic electro-luminescence display device according to the invention includes: preparing a substrate provided with a plurality of pixel electrodes; forming a bank layer so as to be placed on the periphery of each pixel electrode to define a plurality of pixel regions and contain a metal ion adsorbent; forming an organic electro-luminescence film so as to be placed on the bank layer and the plurality of pixel electrodes and contain a metal complex which is a compound having a ligand coordinated to a metal ion; and forming a common electrode on the organic electro-luminescence film, wherein the organic electro-luminescence film is formed such that the concentration of the metal ions is decreased above the bank layer by the metal ion adsorbent. According to the invention, in the organic electro-luminescence film, the concentration of the metal ions above the bank layer is decreased, and therefore, an electric charge is difficult to flow in the horizontal direction. Due to this, electric color mixing caused by light emission of an adjacent pixel can be prevented. Further, it is only necessary to form the bank layer so as to contain a metal ion adsorbent for decreasing the concentration of the metal ions in the organic electro-luminescence film, and therefore, an additional machining process is not needed so that the cost is also not increased.

(2) The method of fabricating an organic electro-luminescence display device according to (1) may be configured such that the bank layer is formed from an insulating material containing the metal ion adsorbent.

(3) The method of fabricating an organic electro-luminescence display device according to (1) may be configured such that the bank layer is formed so as to include a lower layer and an upper layer, the lower layer is formed from an insulating material, and the upper layer is formed from the metal ion adsorbent.

(4) The method of fabricating an organic electro-luminescence display device according to (3) may be configured such that the upper layer is formed so as to cover the entire lower layer.

(5) The method of fabricating an organic electro-luminescence display device according to (3) may be configured such that the upper layer is formed so as to be placed on the upper surface of the lower layer while avoiding the side surface thereof.

(6) The method of fabricating an organic electro-luminescence display device according to any one of (1) to (5) may be configured such that the step of forming an organic electro-luminescence film includes a step of forming each of a hole injection layer and a light-emitting layer so as to be laminated on the plurality of pixel electrodes, and a step of forming an electron injection layer so as to be laminated on the hole injection layer and the light-emitting layer, each of the hole injection layer and the light-emitting layer is formed so as to be separated for each of the plurality of pixel regions, thereby exposing a part of the bank layer, the electron injection layer is formed so as to be in contact with the part of the bank layer exposed from the hole injection layer and the light-emitting layer, and in the step of forming an electron injection layer, the metal ions contained in the electron injection layer are adsorbed by the metal ion adsorbent from the contact region with the bank layer.

(7) The method of fabricating an organic electro-luminescence display device according to any one of (1) to (5) may be configured such that the step of forming an organic electro-luminescence film includes a step of forming each of a hole injection layer and a light-emitting layer so as to continuously cover the plurality of pixel electrodes and the bank layer, and a step of forming an electron injection layer so as to be laminated on the hole injection layer and the light-emitting layer above the bank layer, and in the step of forming an electron injection layer, the metal ions contained in the electron injection layer are diffused in the hole injection layer and the light-emitting layer and adsorbed by the metal ion adsorbent.

(8) An organic electro-luminescence display device according to the invention includes: a substrate provided with a plurality of pixel electrodes; a bank layer provided so as to be placed on the periphery of each pixel electrode to define a plurality of pixel regions and contain a metal ion adsorbent; an organic electro-luminescence film provided so as to be placed on the bank layer and the plurality of pixel electrodes and contain a metal complex which is a compound having a ligand coordinated to a metal ion; and a common electrode provided on the organic electro-luminescence film, wherein the organic electro-luminescence film has a region, in which the concentration of the metal ions is lower than in the other region, above the bank layer. According to the invention, in the organic electro-luminescence film, the concentration of the metal ions above the bank layer is decreased, and therefore, an electric charge is difficult to flow in the horizontal direction. Due to this, electric color mixing caused by light emission of an adjacent pixel can be prevented. Further, it is only necessary to form the bank layer so as to contain a metal ion adsorbent for decreasing the concentration of the metal ions in the organic electro-luminescence film, and therefore, an additional machining process is not needed so that the cost is also not increased.

(9) The organic electro-luminescence display device according to (8) may be configured such that the bank layer is formed from an insulating material containing the metal ion adsorbent.

(10) The organic electro-luminescence display device according to (8) may be configured such that the bank layer includes a lower layer formed from an insulating material and an upper layer formed from the metal ion adsorbent.

(11) The organic electro-luminescence display device according to (10) may be configured such that the upper layer is formed so as to cover the entire lower layer.

(12) The organic electro-luminescence display device according to (10) may be configured such that the upper layer is formed so as to be placed on the upper surface of the lower layer while avoiding the side surface thereof.

(13) The organic electro-luminescence display device according to any one of (8) to (12) may be configured such that the organic electro-luminescence film includes a hole injection layer and a light-emitting layer, each of which is laminated on the plurality of pixel electrodes, and an electron injection layer which is laminated on the hole injection layer and the light-emitting layer, each of the hole injection layer and the light-emitting layer is separated for each of the plurality of pixel regions, thereby exposing a part of the bank layer, and the electron injection layer is in contact with the part of the bank layer exposed from the hole injection layer and the light-emitting layer.

(14) The organic electro-luminescence display device according to any one of (8) to (12) may be configured such that the organic electro-luminescence film includes a hole injection layer and a light-emitting layer, each of which continuously covers the plurality of pixel electrodes and the bank layer, and an electron injection layer which is laminated on the hole injection layer and the light-emitting layer above the bank layer.

DETAILED DESCRIPTION OF THE INVENTION

Figure 1:
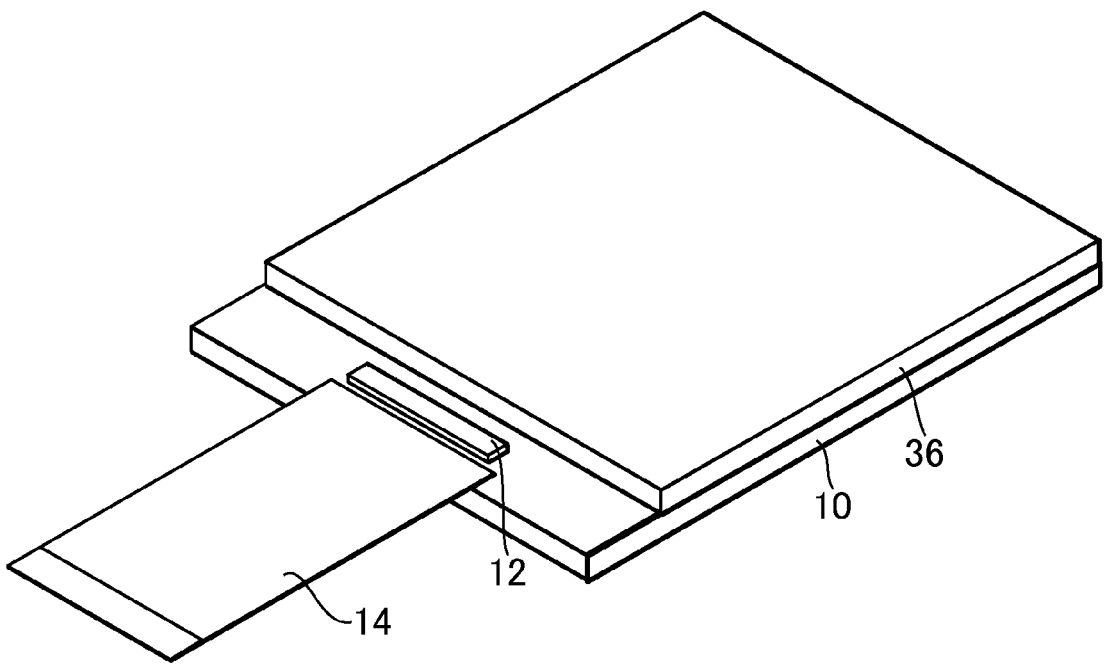
FIG. 1 is a perspective view of an organic electro-luminescence display device according to an embodiment of the invention.
Figure 2:
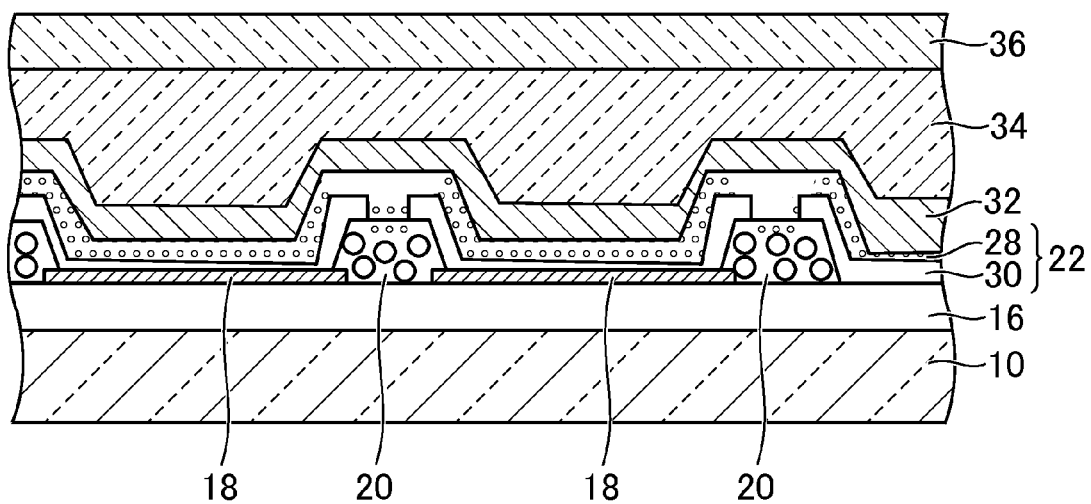
FIG. 2 is an enlarged cross-sectional view of a part of the organic electro-luminescence display device shown in FIG. 1.

Hereinafter, an embodiment of the invention will be described with reference to the accompanying drawings. FIG. 1 is a perspective view of an organic electro-luminescence display device according to an embodiment of the invention. FIG. 2 is an enlarged cross-sectional view of apart of the organic electro-luminescence display device shown in FIG. 1.

As shown in FIG. 1, an organic electro-luminescence display device includes a light transmissive first substrate 10 made of glass or the like. The first substrate 10 is mounted with an integrated circuit chip 12 for driving an element for displaying an image. To the first substrate 10, a flexible wiring board 14 is connected for electrical connection to the outside.

As shown in FIG. 2, the first substrate 10 is provided with a circuit layer 16. The circuit layer 16 includes a wiring, a thin-film transistor, an insulating film, and the like (all of which are not shown). The first substrate 10 is provided with a plurality of pixel electrodes 18 (specifically on the circuit layer 16). The pixel electrodes 18 are anodes. A bank layer 20 is provided in a region between the adjacent pixel electrodes 18 such that the bank layer is placed on the end of each pixel electrode 18. The bank layer 20 is placed on the periphery of each pixel electrode 18 to define a plurality of pixel regions.

The bank layer 20 is provided so as to contain a metal ion adsorbent. Manganese oxide such as $\lambda$-$MnO_2$ as an example of the metal ion adsorbent absorbs lithium ions. $\lambda$-$MnO_2$ can be obtained by mixing predetermined amounts of manganese oxide and lithium hydroxide, followed by firing, and then, performing a treatment with hydrochloric acid in the end, however, a commercially available product may be used. The bank layer 20 is formed from an insulating material (a polyimide resin) containing a metal ion adsorbent (for example, manganese oxide).

The first substrate 10 is provided with an organic electro-luminescence film 22. The organic electro-luminescence film 22 is placed on the bank layer 20 and the plurality of pixel electrodes 18. The organic electro-luminescence film 22 is composed of a plurality of layers.

Figure 3:
FIG. 3 is an enlarged cross-sectional view of a part of an organic electro-luminescence film.

FIG. 3 is an enlarged cross-sectional view of a part of the organic electro-luminescence film 22. For example, on the plurality of pixel electrodes 18, a hole injection layer 24 is laminated, on the hole injection layer 24, a light-emitting layer 26 is laminated, and on the light-emitting layer 26, an electron injection layer 28 is laminated. In FIG. 2, the electron injection layer 28 and a layer 30 provided thereunder are shown. The organic electro-luminescence film 22 contains a metal complex which is a compound having a ligand coordinated to a metal ion. For example, the electron injection layer 28 contains lithium ions as the metal ions. Since the electron injection layer 28 contains metal ions (for example, lithium ions), an electric current easily flows.

On the organic electro-luminescence film 22 (electron injection layer 28), a common electrode 32 is provided. The common electrode 32 is a cathode. By applying a voltage to the pixel electrodes 18 and the common electrode 32, holes and electrons are injected from the electrodes, respectively, into the organic electro-luminescence film 22. The injected holes and electrons are bound to each other in the light-emitting layer 26, thereby emitting light. Since the bank layer 20 is interposed between the end of each pixel electrode 18 and the common electrode 32, a short circuit therebetween is prevented.

On the common electrode 32, a sealing film (not shown) is provided. The sealing film seals the organic electro-luminescence film 22 so as to block water. On the sealing film, a filling layer 34 is provided. Further, a second substrate 36 is provided facing the first substrate 10 with an interval therebetween. The filling layer 34 is provided between the first substrate 10 and the second substrate 36.

As shown in FIG. 2, the layer 30 (composed of the light-emitting layer 26 and the hole injection layer 24) provided under the electron injection layer 28 is separated for each of the plurality of pixel regions. Apart of the bank layer 20 is exposed from the layer 30 (composed of the light-emitting layer 26 and the hole injection layer 24) provided under the electron injection layer 28. The electron injection layer 28 is in contact with the part of the bank layer 20 exposed from the hole injection layer 24 and the light-emitting layer 26. As described above, the bank layer 20 contains a metal ion adsorbent, and the electron injection layer 28 contains metal ions. Therefore, the metal ions (for example, lithium ions) in the electron injection layer 28 are adsorbed by the metal ion adsorbent (manganese oxide such as $\lambda\text{-}MnO_2$) in the bank layer 20. Accordingly, in a region of the electron injection layer 28 above the bank layer 20, the concentration of the metal ions (lithium ions) is lower than in the other region. That is, the organic electro-luminescence film 22 has a region, in which the concentration of the metal ions is lower than in the other region, above the bank layer 20.

According to this embodiment, in the organic electro-luminescence film 22, the concentration of the metal ions is decreased above the bank layer 20, and therefore, an electric charge is difficult to flow in the horizontal direction. Due to this, electric color mixing caused by light emission of an adjacent pixel can be prevented, and thus, the display quality is improved by the improvement of color reproducibility, the reduction in visual angle dependence, and the like. Further, it is only necessary to form the bank layer 20 so as to contain a metal ion adsorbent for decreasing the concentration of the metal ions in the organic electro-luminescence film 22, and therefore, an additional machining process is not needed so that the cost is also not increased.

Next, a method of fabricating the organic electro-luminescence display device according to this embodiment will be described.

In this embodiment, as shown in FIG. 2, a first substrate 10 provided with a plurality of pixel electrodes 18 is prepared. Then, a bank layer 20 is formed on the first substrate 10. The bank layer 20 is formed so as to be placed on the periphery of each pixel electrode 18 to define a plurality of pixel regions. The bank layer 20 is formed from an insulating material containing a metal ion adsorbent. For example, a layer is formed by adding a metal ion adsorbent (for example, manganese oxide which adsorbs lithium ions (such as $\lambda\text{-}MnO_2$) to an insulating material such as a polyimide resin, and the resulting layer is patterned, whereby the bank layer 20 is formed. As the patterning method, photolithography can be applied.

An organic electro-luminescence film 22 is formed so as to be placed on the bank layer 20 and the plurality of pixel electrodes 18. The organic electro-luminescence film 22 is formed from a material containing a metal complex which is a compound having a ligand coordinated to a metal ion. For example, as shown in FIG. 3, each of a hole injection layer 24 and a light-emitting layer 26 is formed so as to be laminated on the plurality of pixel electrodes 18. Each layer 30 composed of the hole injection layer 24 and the light-emitting layer 26 is formed so as to be separated for each of the plurality of pixel regions as shown in FIG. 2. According to this, a part of the bank layer 20 is exposed from the hole injection layer 24 and the light-emitting layer 26.

An electron injection layer 28 is formed so as to be laminated on the layer 30 composed of the hole injection layer 24 and the light-emitting layer 26. The electron injection layer 28 is formed such that a part of the bank layer 20 is exposed from the hole injection layer 24 and the light-emitting layer 26. In a step of forming the electron injection layer 28, metal ions (for example, lithium ions) contained in the electron injection layer 28 are adsorbed by the metal ion adsorbent (for example, manganese oxide such as $\lambda\text{-}MnO_2$) from a region where the electron injection layer 28 is in contact with the bank layer 20. In the organic electro-luminescence film 22 (specifically, in the electron injection layer 28), the concentration of the metal ions is decreased above the bank layer 20 due to the metal ion adsorbent. Thereafter, on the organic electro-luminescence film 22, a common electrode 32 is formed.

According to this embodiment, it is only necessary to form the bank layer 20 so as to contain a metal ion adsorbent for decreasing the concentration of the metal ions in the organic electro-luminescence film 22, and therefore, an additional machining process is not needed so that the cost is also not increased.

First Modification

Figure 4:
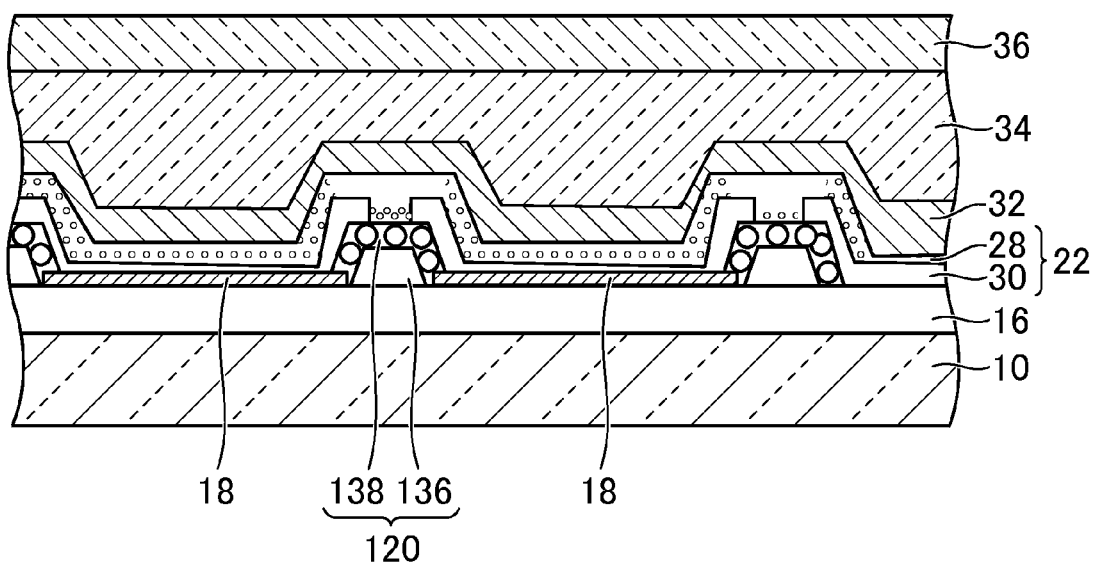
FIG. 4 is a cross-sectional view showing an organic electro-luminescence display device according to a first modification of the embodiment.

FIG. 4 is a cross-sectional view showing an organic electro-luminescence display device according to a first modification of the embodiment. In this modification, a bank layer 120 includes a lower layer 136 formed from an insulating material and an upper layer 138 formed from a metal ion adsorbent. The lower layer 136 does not contain a metal ion adsorbent. The upper layer 138 is formed so as to cover the entire lower layer 136. That is, the upper layer 138 is a surface layer of the bank layer 120, and the lower layer 136 is a core layer of the bank layer 120.

The bank layer 120 is formed so as to contain the lower layer 136 and the upper layer 138. The lower layer 136 is formed from an insulating material which does not contain a metal ion adsorbent. The upper layer 138 is formed from a metal ion adsorbent by, for example, application thereof. The upper layer 138 is formed so as to cover the entire lower layer 136. The other configurations and the operational effects of this modification correspond to those described in the above embodiment.

Second Modification

Figure 5:
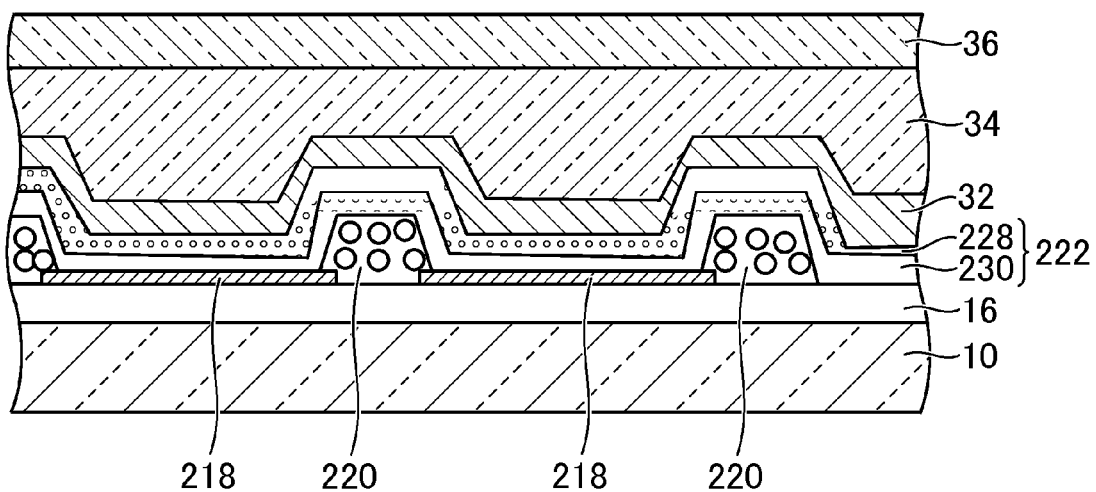
FIG. 5 is a cross-sectional view showing an organic electro-luminescence display device according to a second modification of the embodiment.

FIG. 5 is a cross-sectional view showing an organic electro-luminescence display device according to a second modification of the embodiment. In this modification, a layer 230 composed of a hole injection layer and a light-emitting layer continuously covers a plurality of pixel electrodes 218 and a bank layer 220. Further, an electron injection layer 228 is laminated on the layer 230 composed of a hole injection layer and a light-emitting layer above the bank layer 220. That is, the electron injection layer 228 does not come in contact with the bank layer 220.

In a step of forming an organic electro-luminescence film 222, the layer 230 composed of a hole injection layer and a light-emitting layer is formed so as to continuously cover the plurality of pixel electrodes 218 and the bank layer 220. In the step of forming an organic electro-luminescence film 222, the electron injection layer 228 is formed so as to be laminated on the layer 230 composed of a hole injection layer and a light-emitting layer above the bank layer 220. In a step of forming the electron injection layer 228, metal ions contained in the electron injection layer 228 are diffused in the layer 230 composed of a hole injection layer and a light-emitting layer and adsorbed by the metal ion adsorbent. Therefore, in the electron injection layer 228, the concentration of the metal ions is decreased above the bank layer 220, and therefore, an electric charge is difficult to flow in the horizontal direction.

The other configurations and the operational effects of this modification correspond to those described in the above embodiment.

Third Modification

Figure 6:
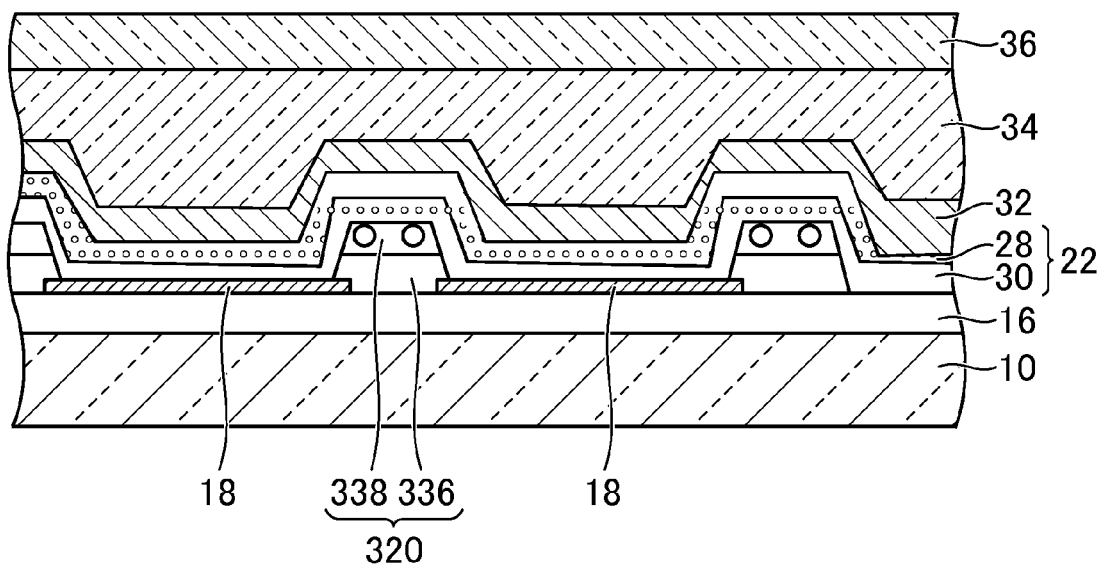
FIG. 6 is a cross-sectional view showing an organic electro-luminescence display device according to a third modification of the embodiment.

FIG. 6 is a cross-sectional view showing an organic electro-luminescence display device according to a third modification of the embodiment. In this modification, a bank layer 320 includes a lower layer 336 formed from an insulating material and an upper layer 338 formed from a metal ion adsorbent. The lower layer 336 does not contain a metal ion adsorbent. The upper layer 338 is formed so as to be placed on the upper surface of the lower layer 336 while avoiding the side surface thereof. That is, the upper surface of the lower layer 336 is covered with the upper layer 338, however, the side surface thereof is exposed from the upper layer 338.

The bank layer 320 is formed so as to contain the lower layer 336 and the upper layer 338. The lower layer 336 is formed from an insulating material. The upper layer 338 is formed from a metal ion adsorbent. The upper layer 338 is formed so as to be placed on the upper surface of the lower layer 336 while avoiding the side surface thereof. The other configurations and the operational effects of this modification correspond to those described in the above embodiment.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A method of fabricating an organic electro-luminescence display device, comprising:
   preparing a substrate provided with a plurality of pixel electrodes;
   forming a bank layer so as to be placed on the periphery of each pixel electrode to define a plurality of pixel regions and contain a metal ion adsorbent;
   forming an organic electro-luminescence film so as to be placed on the bank layer and the plurality of pixel electrodes and contain a metal complex which is a compound having a ligand coordinated to a metal ion; and
   forming a common electrode on the organic electro-luminescence film, wherein
   the step of forming an organic electro-luminescence film includes a step of forming each of a hole injection layer and a light-emitting layer so as to be laminated on the plurality of pixel electrodes, and a step of forming an electron injection layer so as to be laminated on the hole injection layer and the light-emitting layer,
   each of the hole injection layer and the light-emitting layer is formed so as to be separated for each of the plurality of pixel regions, thereby exposing a part of the bank layer,
   the electron injection layer is formed so as to be in contact with the part of the bank layer exposed from the hole injection layer and the light-emitting layer, and
   in the step of forming an electron injection layer, the metal ions contained in the electron injection layer are adsorbed by the metal ion adsorbent from the contact region with the bank layer,
   the organic electro-luminescence film is formed such that the concentration of the metal ions is decreased above the bank layer by the metal ion adsorbent.

2. The method of fabricating an organic electro-luminescence display device according to claim 1, wherein the bank layer is formed from an insulating material containing the metal ion adsorbent.

3. The method of fabricating an organic electro-luminescence display device according to claim 1, wherein
   the bank layer is formed so as to include a lower layer and an upper layer,
   the lower layer is formed from an insulating material, and the upper layer is formed from the metal ion adsorbent.

4. The method of fabricating an organic electro-luminescence display device according to claim 3, wherein
   the upper layer is formed so as to cover the entire lower layer.

5. The method of fabricating an organic electro-luminescence display device according to claim 3, wherein
   the upper layer is formed so as to be placed on the upper surface of the lower layer while avoiding the side surface thereof.

6. An organic electro-luminescence display device, comprising:
   a substrate provided with a plurality of pixel electrodes;
   a bank layer which is placed on the periphery of each pixel electrode, defines a plurality of pixel regions, and contains a metal ion adsorbent;
   an organic electro-luminescence film including a hole injection layer laminated on the plurality of pixel electrodes, a light-emitting layer laminated on the hole injection layer, and an electron injection layer laminated on the light-emitting layer,
   wherein
   each of the hole injection layer and the light-emitting layer is separated for each of the plurality of pixel regions, and exposes a part of the bank layer,
   the electron injection layer is in contact with the part of the bank layer, and
   the organic electro-luminescence film has a lower concentration of metal ions in a first region above the bank layer than in residual second regions excluding the first region.

7. The organic electro-luminescence display device according to claim 6, wherein
   the bank layer is formed from an insulating material containing the metal ion adsorbent.

8. The organic electro-luminescence display device according to claim 6, wherein
   the bank layer includes a lower layer formed from an insulating material and an upper layer formed from the metal ion adsorbent.

9. The organic electro-luminescence display device according to claim 8, wherein
   the lower layer has an upper surface and a side surface which intersects the upper surface, and
   the upper layer is formed so as to cover the upper surface and the side surface.

10. The organic electro-luminescence display device according to claim 8, wherein
    the upper layer is formed so as to be placed on the upper surface of the lower layer while avoiding the side surface thereof.

11. The organic electro-luminescence display device according to claim 6, wherein the first region faces the part of the bank layer.

12. The organic electro-luminescence display device according to claim 6, wherein
    the electron injection layer has the first region, and the first region includes a portion which is in contact with the part of the bank layer.

\* \* \* \* \*